United States Patent
Hoang et al.

(10) Patent No.: US 7,411,464 B1
(45) Date of Patent: Aug. 12, 2008

(54) SYSTEMS AND METHODS FOR MITIGATING PHASE JITTER IN A PERIODIC SIGNAL

(75) Inventors: Tim T Hoang, San Jose, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 75 days.

(21) Appl. No.: 11/430,469

(22) Filed: May 8, 2006

(51) Int. Cl.
*H03B 5/24* (2006.01)
*H03L 1/00* (2006.01)
*H03L 7/099* (2006.01)

(52) U.S. Cl. .............. 331/57; 331/2; 331/10; 331/34; 331/177 R; 331/179; 331/186

(58) Field of Classification Search .......... 331/2, 331/10, 25, 34, 57, 175, 179, 185, 186, 177 R, 331/177 V; 327/156–159
See application file for complete search history.

(56) References Cited

U.S. PATENT DOCUMENTS

| | | | | |
|---|---|---|---|---|
| 5,434,525 A | * | 7/1995 | Leonowich | 327/278 |
| 6,008,700 A | * | 12/1999 | Pietrzyk | 331/45 |
| 6,809,602 B2 | * | 10/2004 | Boerstler et al. | 331/57 |

* cited by examiner

*Primary Examiner*—David Mis
(74) *Attorney, Agent, or Firm*—Ropes & Gray LLP

(57) ABSTRACT

An oscillator circuit can generate a periodic signal, and a frequency adjustment circuit can adjust the frequency of the periodic signal. The periodic signal may include phase jitter. In one aspect of the invention, the phase jitter may be mitigated by connecting other circuitry to the oscillator circuit and allowing the other circuitry to draw current. In one embodiment, the other circuitry is connected in parallel with the oscillator circuit. In one embodiment, the other circuitry is configured to draw greater current to mitigate more phase jitter and to draw less current to mitigate less phase jitter. In one embodiment, a greater portion of the other circuitry is connected to the oscillator circuit for higher frequencies and a lesser portion of the other circuitry is connected to the oscillator circuit for lower frequencies.

15 Claims, 6 Drawing Sheets

SYSTEMS AND METHODS FOR MITIGATING PHASE JITTER IN A PERIODIC SIGNAL

BACKGROUND OF THE INVENTION

This invention relates to providing periodic signals and, more particularly, to mitigating phase/period jitter in periodic signals.

Existing technological applications use periodic signals for various purposes, such as timing or modulation. An ideal periodic signal includes a basic waveform (sometimes called a characteristic waveform) that is repeated cyclically, where each instance of the basic waveform is called a "cycle." It is well known that in an ideal periodic signal the amount of time spanned by each cycle is the same and is called a period. Additionally, the number of cycles per second is called frequency.

Periodic signals used in existing technologies generally must be generated. In reality, these generated periodic signals may be non-ideal at least because some cycles may be longer or shorter than they ideally should be. In other words, the "period" of the periodic signal does not stay the same and may vary from cycle to cycle. This variation is often called "period jitter" or "phase jitter." For convenience, the term phase jitter will be used from this point on to this phenomenon.

Phase jitter may cause undesirable effects in technological applications. For example, when a periodic signal is used to time particular operations, phase jitter may cause the operations to be mis-timed and may cause the operations to fail. Therefore, decreasing phase jitter may be important. Accordingly, there is continued interest in developing systems and methods for decreasing phase jitter in periodic signals.

SUMMARY OF THE INVENTION

The disclosed invention provides systems and methods for generating a periodic signal and for mitigating phase jitter in the periodic signal. A periodic signal can be generated using an oscillator circuit. A frequency adjustment circuit in communication with the oscillator circuit can adjust the frequency of the periodic signal.

In one aspect of the invention, phase jitter may be related to unintended current in or flowing through the oscillator circuit. In one aspect of the invention, the phase jitter can be mitigated by increasing the amount of current flowing through the oscillator circuit. The amount of current can be increased by activating other circuitry and allowing the other circuitry to draw current. As the amount of intended current increases, the intended current may dominate particular effects in the oscillator circuit, thereby mitigating the effects of the unintended current.

Those skilled in the art will recognize that phase jitter is more harmful in higher frequency periodic signals than in lower frequency periodic signals. In accordance with one aspect of the invention, the oscillator circuit can generate a first periodic signal having a first frequency. A portion of the other circuitry can be connected to the oscillator circuit to mitigate phase jitter in the first periodic signal. When the oscillator circuit is called upon to generate a second periodic signal, the frequency of the second periodic signal can determine the amount of phase jitter that needs to be mitigated. If the second frequency is lower than the first frequency, a smaller portion of the other circuitry can be connected to the oscillator circuit because phase jitter generally has a smaller effect at lower frequencies. On the other hand, if the second frequency is higher than the first frequency, a larger portion of the other circuitry can be connected to the oscillator circuit because phase jitter generally has a larger effect at higher frequencies.

Further features of the invention, its nature and various advantages, will be more apparent from the accompanying drawings and the following detailed description.

DETAILED DESCRIPTION

Figure 1:
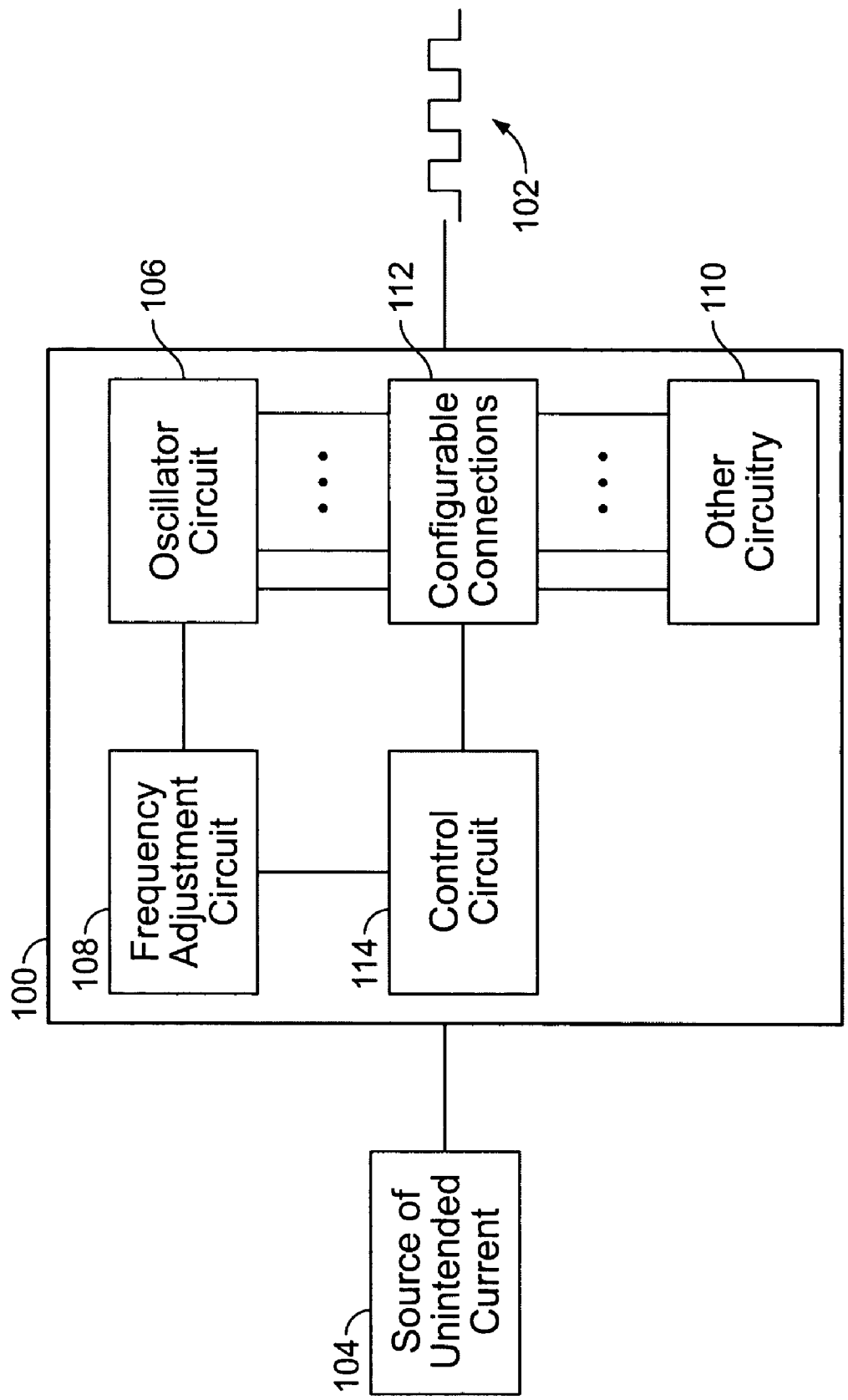
FIG. 1 is a block diagram of an exemplary signal generator for generating a periodic signal in accordance with aspects of the invention.

The disclosed invention relates to providing periodic signals and to mitigating phase jitter in periodic signals. As used herein, the term "period" will be used to refer to the duration of a cycle of a periodic signal. As described above, phase jitter as used herein refers to variations in the periods of some cycles of a periodic signal. Worded another way, phase jitter also refers to the occurrence of some cycles at an earlier or later time than they ideally should occur.

Phase jitter can be detrimental in timing-sensitive operations, such as communications operations. For example, suppose a communication signal includes information units that are spaced T seconds apart. Also, suppose a communication receiver uses a periodic signal having an ideal period of T seconds to time the reading of the information units from the communication signal. In this example, variations in the period of the periodic signal can disrupt the receiver's synchronization with the communication signal and can compromise its ability to read the information units in the communication signal. In this case, the receiver may miss some information units or may mistakenly read something that is not an information unit.

For convenience, the description from this point on will describe aspects of the invention using a particular periodic signal called a square wave, which will be familiar to those skilled in the art. However, it is contemplated that the disclosed invention will also apply to periodic signals other than a square wave, such as sine waves.

It is understood that one cause of phase jitter is based on electric charge. This electric charge can exist, for example, in active transistors. A transistor can include electrons that are trapped and released (resulting in "flicker noise"), electrons that move based on temperature (resulting in "thermal noise"), or charge movement based on the bandwidth of the transistor (resulting in "white noise"). These forms of charge movement are generally unintended and, therefore, undesirable. Because charge movement defines "current," these undesirable forms of charge movement in a transistor result in undesirable currents which interfere with intended currents in the transistor. Aside from transistors, it is also known that unintended currents/charge movement may occur in other electronic devices and circuits, as well.

One way that undesirable currents can result in phase jitter in a periodic signal is by affecting the circuit generating the periodic signal. For example, a circuit that generates a periodic signal may include capacitances, such as capacitor components or parasitic capacitances. Capacitances have the well-known voltage-current relationship $i=C(dv/dt)$, where C is the value of the capacitance, i is the amount of the current flowing across the capacitance, and $dv/dt$ is the rate of change of voltage across the capacitance. In this case, the periodic signal may be generated based on the voltage across the capacitance, or, otherwise, the voltage across the capacitance may somehow adversely affect the periodic signal. In the absence of unintended currents, the voltage can generally be controlled by providing an appropriate amount of intended current to the capacitance at particular times. However, where unintended currents are present, they may interfere with the intended current and, thereby, adversely affect the voltage across the capacitance. This may then lead to phase jitter in the periodic signal. As another example, a circuit may also include inductances, such as inductor components or parasitic inductances resulting from circuit layout. Inductances have the voltage-current relationship $v=L(di/dt)$, where L is the value of the inductance, v is the amount of voltage across the inductance, and $di/dt$ is the rate of change of current flowing through the inductance. In this case, the voltage across the inductance may adversely affect the periodic signal, and unintended currents may affect this voltage based on the inductance relationship above. This may then lead to phase jitter in the periodic signal.

The above descriptions are only some ways by which phase jitter can occur in a periodic signal. Other mechanisms or effects also exist, and they will be known to those skilled in the art. For example, environmental effects (e.g., temperature gradients), device mismatches, or parasitic effects may also cause phase jitter. Those skilled in the art will understand that a "parasitic" effect is a term of art that describes effects resulting from circuit parts that typically are not intended to provide such effects. For example, when a circuit includes a capacitor component, the capacitor is typically intended to provide a capacitance effect and so it is not considered to be a parasitic effect. However, it is well known that two parallel wires can also provide a capacitance effect even though they typically are not intended to do so. Therefore, the capacitance effect resulting from such wires is characterized as a parasitic effect.

Referring now to FIG. 1, there is shown one embodiment of signal generator circuitry 100 for generating a periodic signal. Although the illustrated signal generator 100 is shown to generate a square wave 102, it can also generate periodic signals other than a square wave. The signal generator 100 may be in communication with a source of unintended current 104, which may be another circuit. As described above, the unintended current can cause phase jitter in the periodic signal 102. The unintended current may reach the signal generator 100 through a connection or through the substrate of an integrated circuit. In other embodiments (not shown), the source of unintended current 104 may be internal to the signal generator 100. For example, the source of unintended current 104 may be the transistors in the oscillator circuit 106.

The signal generator includes an oscillator circuit 106 that generates the periodic signal 102 and a frequency adjustment circuit 108 in communication with the oscillator circuit 106 that controls the frequency of the periodic signal 102. The oscillator circuit 106 may provide a range of frequencies or may provide a set of discrete frequencies. The oscillator circuit 106 may be any type of oscillator, including, for example, phase shift oscillators, parallel-T oscillators, beat-frequency oscillators, capacitor charge/discharge oscillators, source-coupled oscillators, negative impedance oscillators, LC oscillators, RC oscillators, quartz crystal oscillators, overtone oscillators, and voltage controlled oscillators. The frequency adjustment circuit 108 operates to configure the oscillator circuit 106 to provide the periodic signal 102 at a particular frequency. For example, if the signal generator 100 is part of a communication device that operates at different frequency bands, the frequency adjustment circuit 108 can configure the frequency of the periodic signal 102 based on the band in which the device desires to operate. The desired frequency may be determined by a user or by another circuit or device. Therefore, the frequency adjustment circuit 108 can receive some input indicating the frequency that needs to be provided, and it can configure the oscillator circuit 106 to provide that frequency. Although the frequency adjustment circuit 108 is illustrated as being external to the oscillator circuit 106, in certain embodiments it can also be part of/internal to oscillator circuit 106.

In accordance with one aspect of the invention, the illustrated signal generator 100 of FIG. 1 includes circuitry for mitigating phase jitter in its generated periodic signal 102. In particular, the signal generator 100 includes some other circuitry 110 in addition to the oscillator circuit 106 and the frequency adjustment circuit 108. This other circuitry 110 may or may not be related to providing the periodic signal 102. In certain embodiments, the other circuitry 110 may be an oscillator circuit or a cell of a voltage controlled oscillator, for example. The other circuitry's role in mitigating phase jitter will become clear by the explanation in the subsequent paragraph below. Additionally, the signal generator 100 includes a network of configurable connections 112 that selectively connects the oscillator circuit 106 and the other circuitry 110, and a control circuit 114 that configures the configurable connections 112. In certain embodiments, some of the connections 112 can be designed to be unchangeable and can be hard-wired. In one embodiment, the connections 112 can include fuses. For example, in one embodiment, some of the connections 112 can be made during circuit fabrication using a hard-wired metal mask. Although the other circuitry 110, the configurable connections 112, and the control circuit 114 are shown to be internal to the signal generator 100, each of them can also be external to the signal generator 100 in certain embodiments. In certain embodiments, the configurable connections 112 can be internal to the oscillator circuit 106 and/or the other circuitry 110. In such embodiments, configuring the configurable connections would be tantamount to configuring the oscillator circuit 106 and/or the other circuitry 110.

In one aspect of the invention, the configurable connections 112 and the other circuitry 110 can operate to mitigate phase jitter in the periodic signal based on what will be referred to herein as "current dominance." In this aspect of the invention, the effects of the unintended current may be mitigated by increasing the proportion or amount of intended current flowing through the signal generator 100. In particular, the other circuitry 110 can be configured to draw or pass current to increase the amount of intended current flowing through the signal generator 100. As the amount of intended current increases, the intended current may dominate particular effects in the signal generator, thereby mitigating the effects of the unintended current. In one aspect of the invention, during current dominance, the input and output connections of the signal generator 100 may include a greater proportion of intended current and a lesser proportion of unintended current. This is because even though the other circuitry 110 may also produce unintended current, this additional unintended current may not be correlated with other unintended current with respect to time. For example, the unintended current from the other circuitry 110 may occur at a time when relatively little other unintended current is occurring. As the proportion of intended current increases, the intended current may dominate particular effects in the signal generator, thereby mitigating the effects of the unintended current. In one embodiment, in order to increase the amount of intended current flowing through the signal generator 100, it may be necessary to configure the configurable connections 112 to connect the other circuitry 110 to the oscillator circuit 106 and/or the frequency adjustment circuit 108. In one aspect of the invention, if the operation of the other circuitry 110 is not necessary for generating the periodic signal 102, the other circuitry can be deactivated when it is not needed, in order to reduce power consumption. This aspect of the invention is described in more detail in connection with FIG. 4. The control circuit 114 can be designed to recognize the occurrence/probable occurrence of phase jitter, or the non-occurrence/probable non-occurrence thereof, and to configure the other circuitry 110 and/or the configurable connections 112 in response to such recognition.

Figure 2:
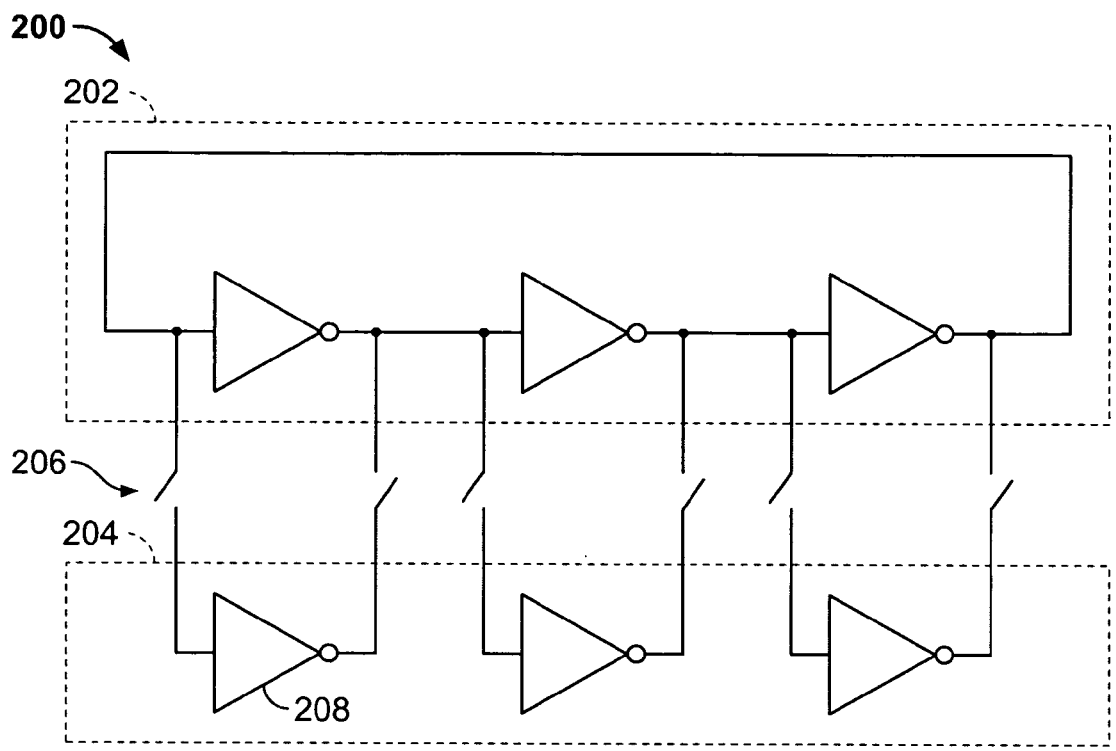
FIG. 2 is a circuit diagram of exemplary circuit that generates a periodic signal and that mitigates phase jitter in the periodic signal.

Referring now to FIG. 2, there is shown one embodiment of a signal generator 200 in accordance with the disclosed invention. The illustrated signal generator 200 includes an oscillator circuit 202, other circuitry 204, and configurable connections 206 between the oscillator circuit 202 and the other circuitry 204. The illustrated oscillator circuit 202 is based on a simple inverter chain that is connected in a loop. The inverters may also be referred to herein as voltage controlled oscillator ("VCO") cells. The odd number of inverters and the feedback connection allow the voltage at each point in the inverter chain to oscillate continuously to produce a periodic signal. Although a frequency adjustment circuit is not shown, those skilled in the art will recognize that the frequency of the periodic signal can be altered by the addition of various components. For example, in one embodiment, resistances and/or capacitances can be coupled to the inverters, and the value of these resistances and capacitances can determine the frequency of the square wave. Additionally, circuitry for initializing the oscillator loop and for powering the oscillator may be part of the oscillator circuit 202, but they are not shown here to simplify the illustration. One aspect of the invention relating to powering the signal generator 200 is described in connection with FIG. 4.

The illustrated embodiment of the other circuitry 204 includes inverters that mirror the inverters of the oscillator circuit 202. When the configurable connections 206 are closed, one or more inverters in the other circuitry 204 can be connected in parallel with corresponding inverters in the oscillator circuit 202. Configured in this manner, the signal generator 200 can pass more current while continuing to produce the periodic signal, thereby using the current dominance effect described above to mitigate phase jitter. In certain embodiments, the configurable connections 206 can include some connections that are hard-wired or that include fuses (not shown), as described above. For example, the outputs of the inverters in the other circuitry 204 can be hard-wired to the oscillator circuit 202.

Figure 9:
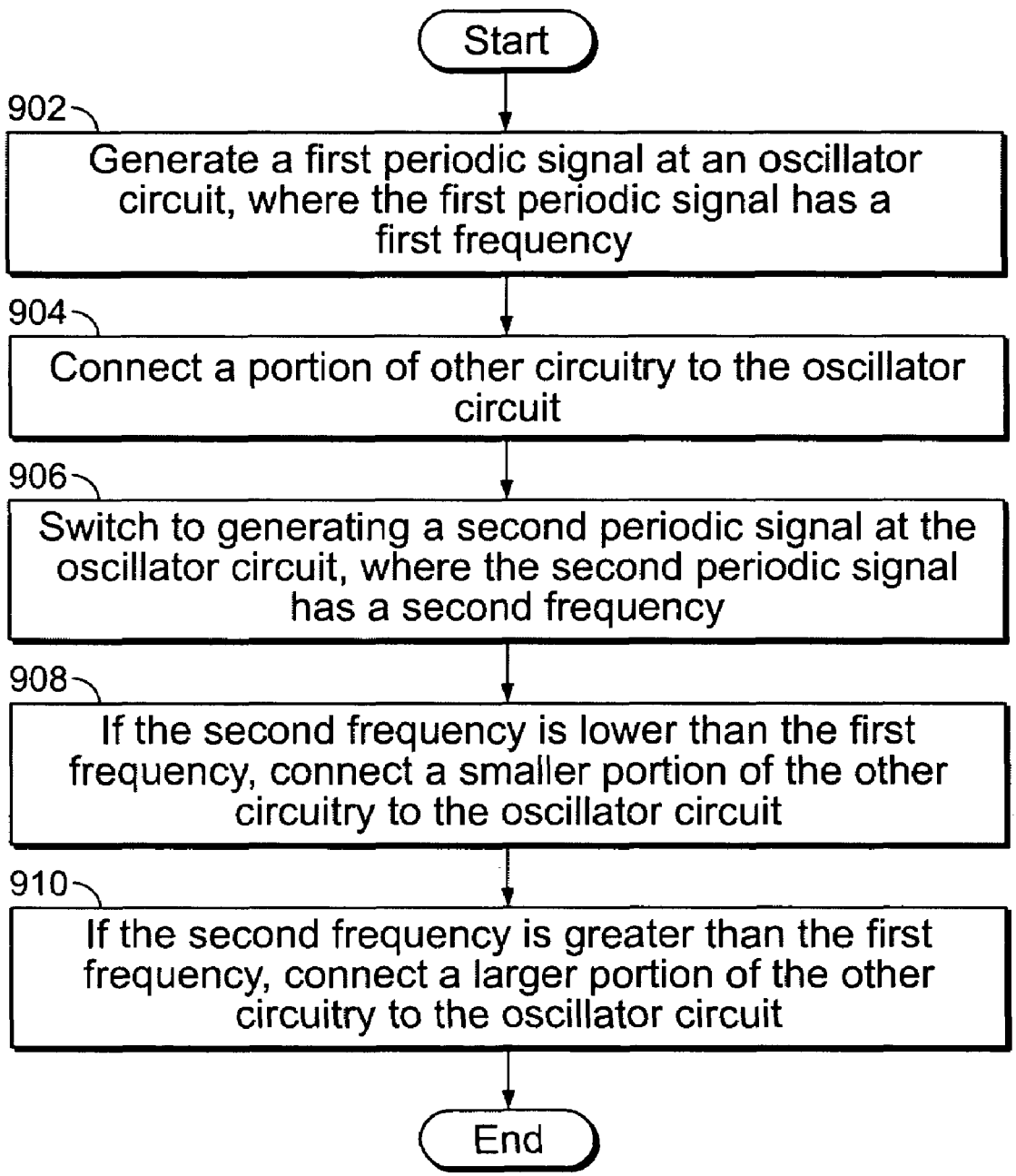
FIG. 9 is a flow diagram of mitigating phase jitter for different periodic signal frequencies.

In one embodiment, as mentioned above, the configurable connections 206 can connect the other circuitry 204 to the oscillator circuit 202 only when it is determined that phase jitter is occurring or is probable. As mentioned above, a control circuit (114, FIG. 1) can make this determination and can configure the configurable connections 206 based on the determination. For example, some or all configurable connections 206 can be closed so that the oscillator circuit 202 and the other circuitry 204 can operate in parallel. In one embodiment, only one VCO cell in the other circuitry 204 (e.g., inverter 208) can be connected in parallel with the oscillator circuit 202 when the phase jitter only needs slight mitigation. As the need to mitigate the phase jitter increases, more VCO cells in the other circuitry 204 can be connected in parallel with the oscillator circuit 202 to mitigate the phase jitter even more. For example, those skilled in the art will recognize that phase jitter is more harmful in higher frequency periodic signals than in lower frequency periodic signals. This is because higher frequency periodic signals have a shorter period, so phase jitter may effect a larger portion of each cycle of a higher frequency periodic signal. Therefore, in one embodiment, more VCO cells in the other circuitry 204 can be connected in parallel with the oscillator circuit 202 as the frequency of the periodic signal increases. Conversely, fewer VCO cells in the other circuitry 204 can be connected in parallel with the oscillator circuit 202 as the frequency of the periodic signal decreases. This aspect of the invention is described in more detail in connection with FIG. 9.

Figure 3:
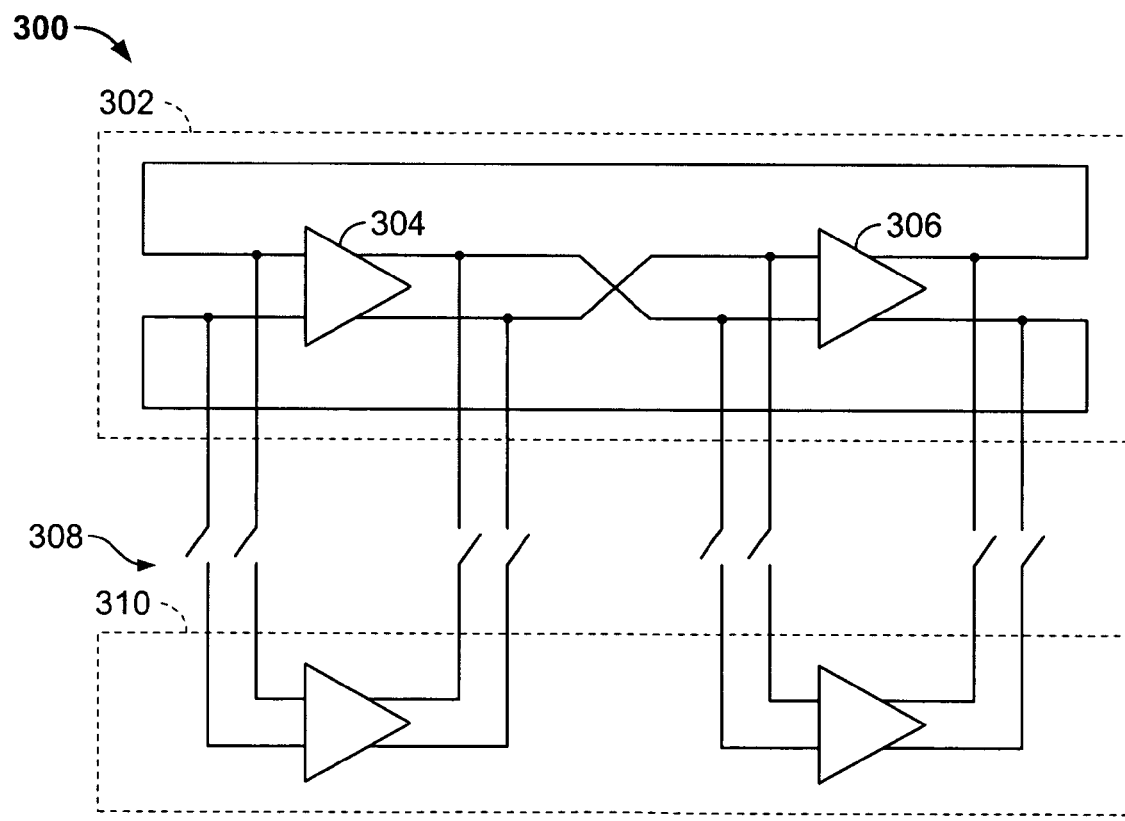
FIG. 3 is a circuit diagram of another exemplary circuit that generates a periodic signal and that mitigates phase jitter.

FIG. 3 shows a variation of the signal generator of FIG. 2, in which the oscillator circuit 302 uses differential signals and includes buffers as VCO cells. The outputs and inputs of one or more of the buffers can be "cross-coupled" to achieve an inverter effect. For example, the differential output of the first buffer 304 is crossed and connected to the differential input of the second buffer 306. This cross-coupling inverts the buffered signal and produces oscillation. The illustrated signal generator 300 includes configurable connections 308 and other circuitry 310 that can operate as previously described in connection with FIG. 2. Additionally, although not shown, the signal generator 300 can also include a frequency adjustment circuit and a control circuit.

The signal generators of FIGS. 2-3 are exemplary and other embodiments are contemplated. For example, one embodiment of an oscillator circuit and a frequency adjustment circuit is shown in U.S. Pat. No. 6,369,624, which is hereby incorporated herein by reference in its entirety.

Figure 4:
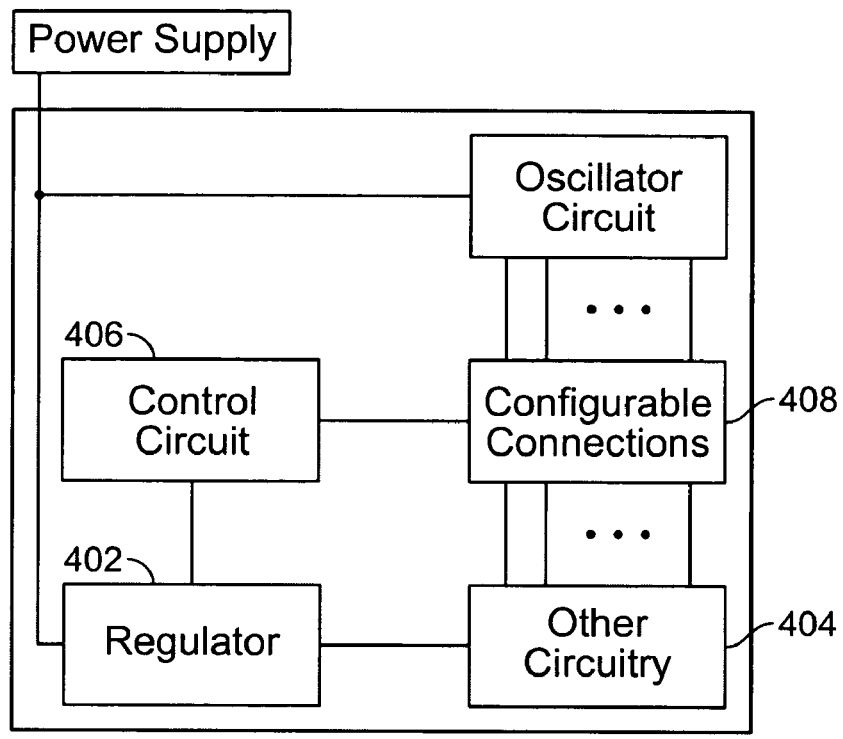
FIG. 4 is a block diagram of an exemplary signal generating that has power-saving capability.

In accordance with one aspect of the invention, FIG. 4 shows a variation of the signal generator of FIG. 1 that includes a power regulator circuit 402. The frequency adjustment circuit (108, FIG. 1) is not shown to simplify the illustration. As mentioned above, the other circuitry 404 may not be related to generating the periodic signal and can be deactivated if it is not needed to mitigate phase jitter. In the illustrated embodiment, the other circuitry can be activated and deactivated using a regulator circuit 402. In particular, the regulator circuit 402 can be configured to provide power to the other circuitry 404 when the other circuitry 404 is needed to mitigate phase jitter. When the other circuitry 404 is not needed to mitigate phase jitter, the regulator circuit 402 can be configured to cease providing power to the other circuitry 404. The configuration of the regulator circuit 402 can be controlled by the control circuit 406. In certain embodiment, the other circuitry 404 can be activated or deactivated by having the control circuit 406 configure the configurable connections 408.

Figure 5:
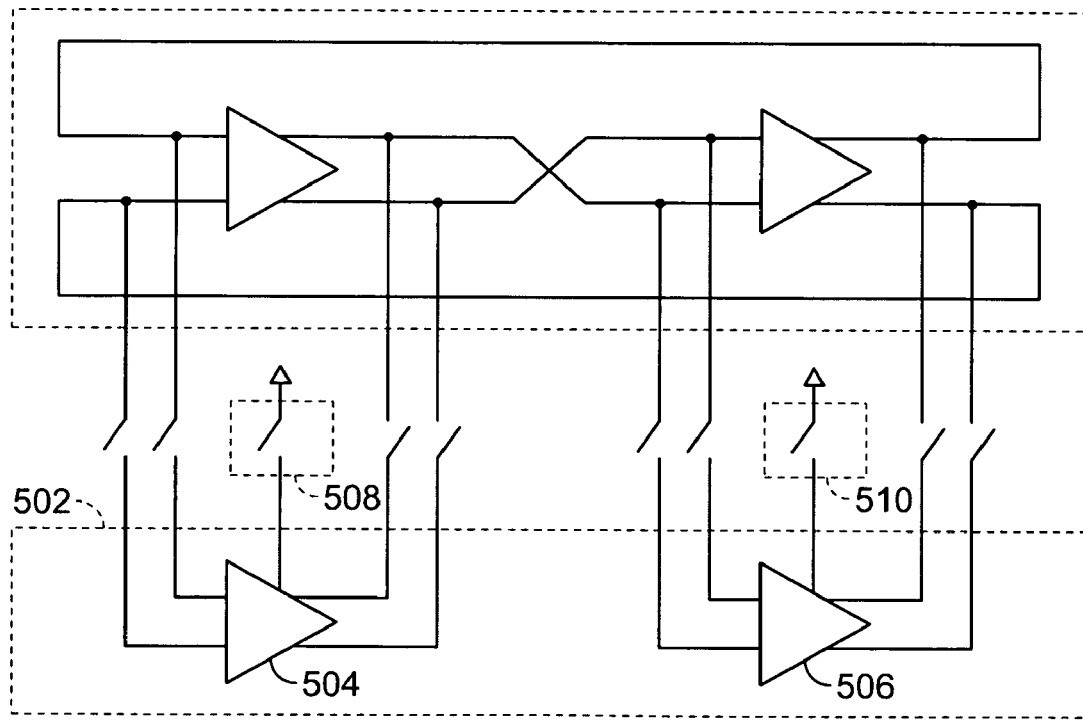
FIG. 5 is a variation of the exemplary circuit of FIG. 3 that includes power-saving capability.

Referring now to FIG. 5, there is shown a variation of the signal generator of FIG. 3 that includes power regulation capability. In particular, the VCO cells 504, 506 in the other circuitry 502 are powered though regulator circuits 508, 510, which are illustrated as switches. The regulator switches 508, 510 can be controlled by a control circuit (406, FIG. 4). When all or part of the other circuitry 502 is not needed to mitigate phase jitter, one or more of the regulator switches 508, 510 can be opened to deactivate their corresponding VCO cells 504, 506 in the other circuitry 502. The switch implementation of the regulator circuits 508, 510 is exemplary, and it is contemplated that other implementations can be used.

Figure 6:
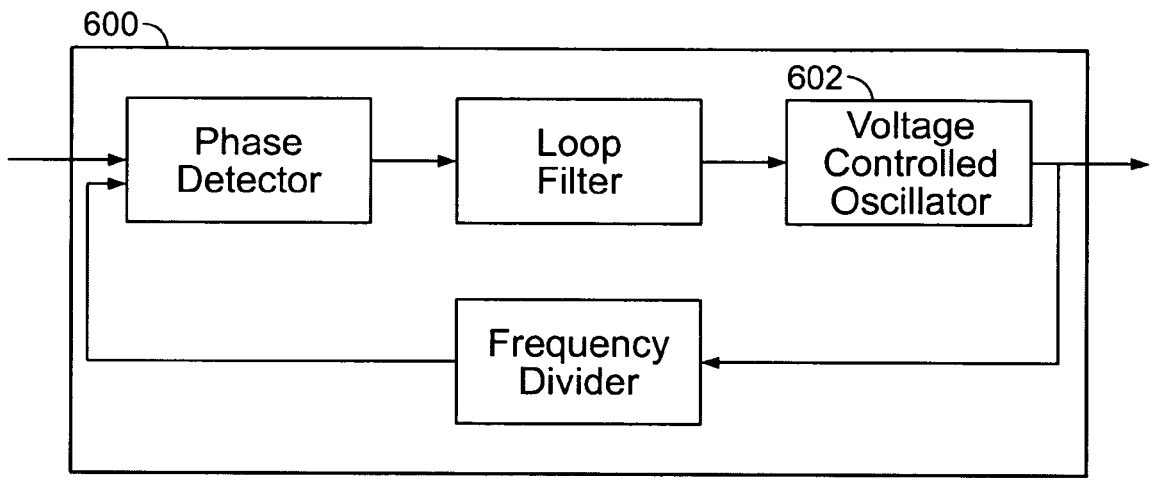
FIG. 6 is a block diagram of an exemplary phase locked loop circuit that can use aspects of the disclosed technology.

In accordance with one aspect of the invention, the signal generator of the present invention can be a voltage controlled oscillator and can be located in a phase locked loop circuit. FIG. 6 shows an exemplary embodiment of a phase locked loop (PLL) circuit 600. The PLL circuit 600 includes a voltage controlled oscillator (VCO) 602 that generates a periodic signal. The frequency of the periodic signal is determined by the value of the input voltage entering the VCO 602. In accordance with aspects of the invention, the VCO signal generator 602 can include an oscillator circuit, a frequency adjustment circuit, other circuitry, configurable connections, a control circuit, and regulator circuitry. As the frequency varies, the control circuit can configure the configurable connections and the regulator circuit to use more or less of the other circuitry to mitigate phase jitter.

Figure 7:
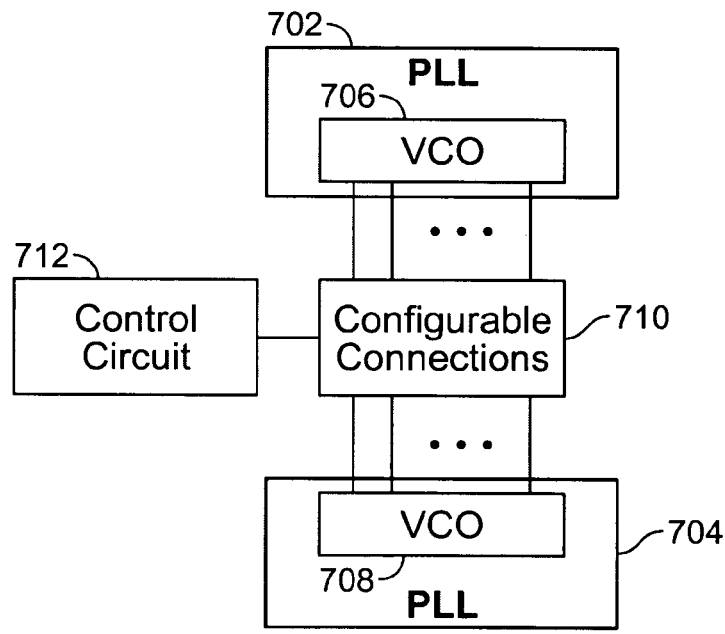
FIG. 7 is a block diagram of an exemplary system that can use aspects of the disclosed technology.

In accordance with one aspect of the invention, the oscillator circuit and the other circuitry used to mitigate phase jitter can be located in different devices. For example, FIG. 7 shows two PLLs 702, 704 that each contain a VCO. The VCOs 706, 708 can each include an oscillator circuit and a frequency adjustment circuit (not shown). In this embodiment, each VCO circuit relies on the other VCO circuit to mitigate its phase jitter. Configurable connections 710 can connect the two VCOs 706, 708 to each other. As before, a control circuit 712 can configure the configurable connections 710 based on an occurrence or a probable occurrence of phase jitter. For example, fewer of the configurable connections 710 may be connected for lower frequency periodic signals, but more of the configurable connections 710 may be connected for higher frequency periodic signals. The control circuit 712 may also need to coordinate the operations of the PLLs 702, 704 so that when one PLL needs phase jitter to be mitigated, all or a portion of the other PLL can be made available.

Figure 8:
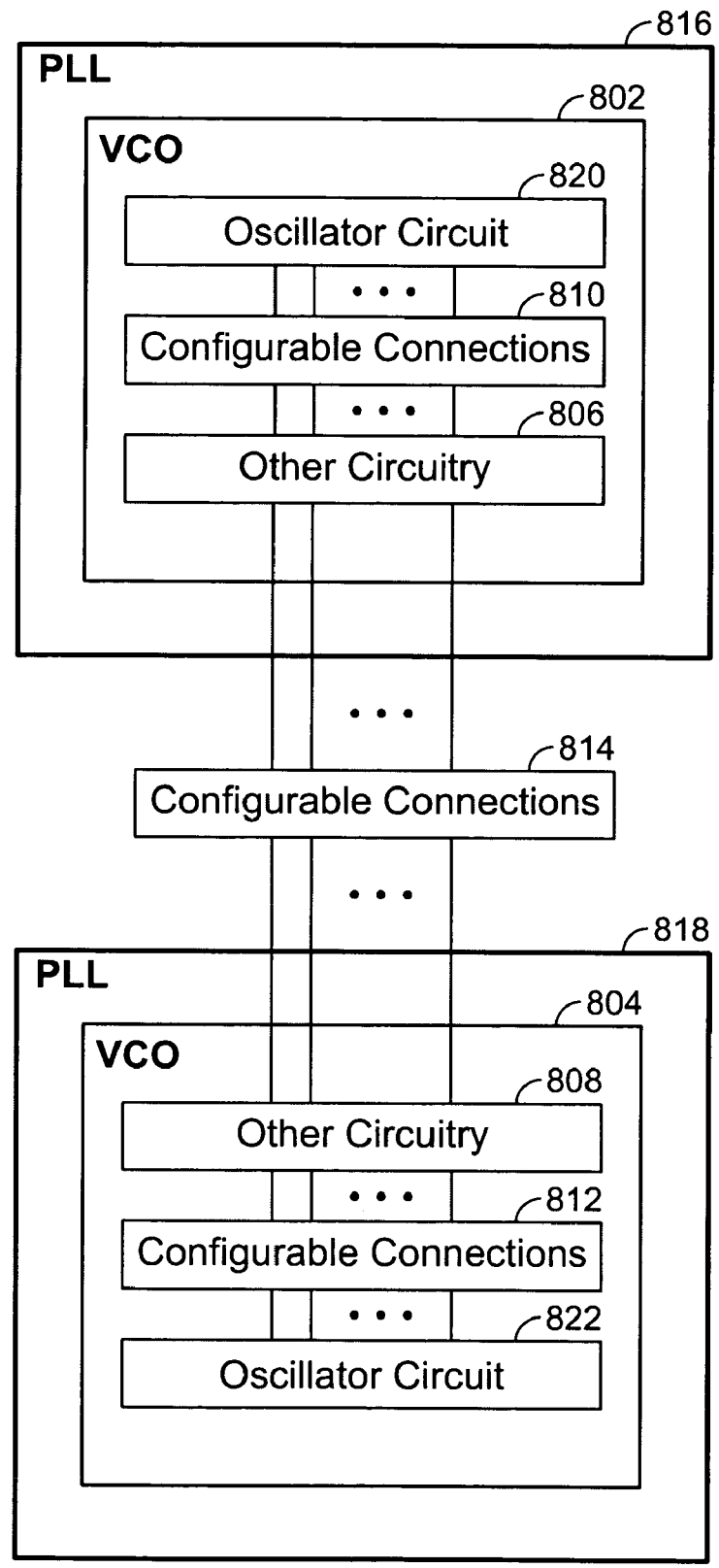
FIG. 8 is a block diagram of another exemplary system that can use aspects of the disclosed technology.

FIG. 8 shows a variation of the system of FIG. 7. For example, the VCOs 802, 804 of FIG. 8 can each include other circuitry 806, 808 and configurable connections 810, 812 for mitigating phase jitter in accordance with the disclosed invention. For example, each of the VCOs 802, 804 can be a signal generator as shown in FIG. 1. The "other circuitry" 806, 808 of the VCOs 802, 804 can be connected to each other by the configurable connections 814 outside the PLLs 816, 818. In this manner, the PLLs 816, 818 can access a portion of each other's circuitry (i.e., 806, 808) for the purpose of mitigating phase jitter, while allowing both PLLs 816, 818 to continue operating simultaneously using their own oscillator circuits 820, 822.

Variations of the systems shown in FIGS. 7-8 are contemplated. For example, a system in accordance with the disclosed invention can include than two PLLs, and can include complex networks of configurable connections to inter-connect the PLLs. There may be more than one control circuit, and the control circuits may be organized into multiple levels of control. For example, some control circuits may control other control circuits.

Accordingly, what has been described thus far are systems and methods for generating a periodic signal and for mitigating phase jitter in the periodic signal. A periodic signal can be generated using an oscillator circuit. A frequency adjustment circuit in communication with the oscillator circuit can adjust the frequency of the periodic signal.

Phase jitter may occur in the periodic signal because of various effects in the oscillator circuit and/or the frequency adjustment circuit, such as capacitance effects, inductance effects, parasitic effects, environmental effects (e.g., temperature gradients), or component mismatches, for example. In one aspect of the invention, phase jitter in the periodic signal can be mitigated by connecting other circuitry to the oscillator circuit.

In one aspect of the invention, phase jitter may be related to unintended current in or flowing through the oscillator circuit. In one aspect of the invention, the phase jitter can be mitigated by increasing the proportion or amount of current flowing through the oscillator circuit. The amount of current can be increased by activating other circuitry and allowing the other circuitry to draw current. As the proportion or amount of intended current increases, the intended current may dominate particular effects in the oscillator circuit, thereby mitigating the effects of the unintended current.

Those skilled in the art will recognize that phase jitter is more harmful in higher frequency periodic signals than in lower frequency periodic signals. This is because higher frequency periodic signals have a shorter period, so phase jitter may effect a larger portion of each cycle of a higher frequency periodic signal. In accordance with one aspect of the invention, and with reference to FIG. 9, there is shown an exemplary method for mitigating phase jitter in a periodic signal using a signal generator that includes an oscillator circuit and other circuitry. The oscillator circuit can generate a first periodic signal having a first frequency 902. A portion of the other circuitry can be connected to the oscillator circuit to mitigate phase jitter in the first periodic signal 904. When the oscillator circuit is called upon to generate a second periodic signal 906, the frequency of the second periodic signal can determine the amount of phase jitter that needs to be mitigated. If the second frequency is lower than the first frequency, a smaller portion of the other circuitry can be connected to the oscillator circuit because phase jitter generally has a smaller effect at lower frequencies 908. On the other hand, if the second frequency is higher than the first frequency, a larger portion of the other circuitry can be connected to the oscillator circuit because phase jitter generally has a larger effect at higher frequencies 910.

One skilled in the art will appreciate that any embodiment described and/or illustrated herein is exemplary and does not limit the scope of the invention as defined by the following claims.

What is claimed is:

1. An apparatus for providing a periodic signal, the apparatus comprising:

a first circuit that generates a periodic signal, wherein the first circuit comprises a sub-circuit that is a voltage controlled oscillator cell;

a second circuit that is substantially identical to the sub-circuit;

configurable connections coupled to the sub-circuit and the second circuit;

a control circuit that configures the configurable connections, wherein in a first configuration, the configurable connections are connected such that the sub-circuit and the second circuit are connected in parallel, and in a second configuration, the configurable connections are disconnected such that the sub-circuit and the second circuit are not connected in parallel; and a regulator circuit coupled to the second circuit wherein the regulator circuit provides power to the second circuit in the first configuration and provides substantially no power to the second circuit in the second configuration.

2. The apparatus of claim 1, further comprising a current-bearing connection that is coupled to the first and second circuits and that is associated with phase jitter in the periodic signal, wherein the current-bearing connection carries a higher current when the configurable connections are in the first configuration and a lower current when the configurable connections are in the second configuration.

3. The apparatus of claim 1, further comprising a frequency adjustment circuit coupled to the first circuit, wherein the frequency adjustment circuit controls a frequency of the periodic signal.

4. The apparatus of claim 3, wherein:
the frequency includes a higher frequency and a lower frequency;
the control circuit configures the configurable connections to be in the first configuration when the frequency is the higher frequency; and
the control circuit configures the configurable connections to be in the second configuration when the frequency is the lower frequency.

5. The apparatus of claim 1, wherein the first circuit is located in a first phase locked loop and the second circuit is located in a second phase locked loop.

6. A voltage controlled oscillator comprising the apparatus of claim 1.

7. An apparatus for providing a periodic signal, the apparatus comprising:
a first circuit that generates a periodic signal having a frequency that is adjustable between a higher frequency and a lower frequency;
a second circuit;
a current-bearing connection that is connected to the first circuit and the second circuit, wherein the current-bearing connection is associated with phase jitter in the periodic signal; and
a control circuit that configures the first and second circuits, wherein in a first configuration, the current-bearing connection carries a greater current, and in a second configuration, the current-bearing connection carries a lesser current, and wherein: the control circuit configures the first and second circuits to be in the first configuration when the frequency of the periodic signal is the higher frequency and to be in the second configuration when the frequency is the lower frequency.

8. The apparatus of claim 7, wherein in the second configuration, the second circuit is configured to use substantially zero current.

9. The apparatus of claim 7, wherein the second circuit is substantially identical to at least a portion of the first circuit.

10. The apparatus of claim 9, wherein each of the portion of the first circuit and the second circuit is a voltage controlled oscillator cell.

11. The apparatus of claim 7, further comprising a frequency adjustment circuit coupled to the first circuit, wherein the frequency adjustment circuit controls the frequency of the periodic signal.

12. A method for mitigating phase jitter in a periodic signal using a signal generator, where the signal generator includes an oscillator circuit and other circuitry, the method comprising:
generating a first periodic signal at the oscillator circuit, wherein the first periodic signal has a first frequency;
connecting a portion of the other circuitry to the oscillator circuit;
switching to generating a second periodic signal at the oscillator circuit, wherein the second periodic signal has a second frequency;
connecting a smaller portion of the other circuitry to the oscillator circuit if the second frequency is lower than the first frequency; and
connecting a larger portion of the other circuitry to the oscillator circuit if the second frequency is higher than the first frequency.

13. The method of claim 12, wherein connecting a portion of the other circuitry to the oscillator circuit includes connecting the portion of the other circuitry to be in parallel with a corresponding portion of the oscillator circuit.

14. The method of claim 13, wherein the portion of the other circuitry is substantially identical to the corresponding portion of the oscillator circuit.

15. The method of claim 14, wherein the portion of the other circuitry is a voltage controlled oscillator cell.

* * * * *